United States Patent [19]
Simburger

[11] Patent Number: 6,127,621
[45] Date of Patent: Oct. 3, 2000

[54] POWER SPHERE

[75] Inventor: Edward J. Simburger, Agoura, Calif.

[73] Assignee: The Aerospace Corporation, El Segundo, Calif.

[21] Appl. No.: 09/282,607

[22] Filed: Apr. 2, 1999

[51] Int. Cl.[7] .................................................. H01L 25/00
[52] U.S. Cl. ........................ 136/246; 136/292; 323/225; 323/906; 307/87
[58] Field of Search ................................. 136/242, 292; 323/225, 906; 307/87

[56] References Cited

U.S. PATENT DOCUMENTS 5,895,982   4/1999   Eng ............................................ 307/87

*Primary Examiner*—Mark Chapman
*Attorney, Agent, or Firm*—Derrick Michael Reid

[57] ABSTRACT

A power sphere has a curved surface upon which are mounted individual indivisible solar cells receiving differing amounts of solar illumination without solar tracking and pointing while providing respective differing amounts of solar power coupled through respective regulators onto a regulated bus for powering a connected load. The respective regulators continue to provide sufficient coupled power onto the bus even in the event of a failure of one or more of the solar cells thereby enabling graceful degradation of power delivery to the load for improved reliability of power delivery, particularly useful in space satellite systems.

6 Claims, 4 Drawing Sheets

SOLAR POWER SPHERE

SOLAR POWER SPHERE

POWER DISTRIBUTION SYSTEM

PARALLEL CONNECTED POWER REGULATORS

POWER SPHERE

REFERENCE TO RELATED APPLICATION

The present application is related to applicant's copending application entitled Power Distribution System, Ser. No. 09/281,653, filed Mar. 30, 1999 by the same inventor.

STATEMENT OF GOVERNMENT INTEREST

The invention was made with Government support under contract No. F04701-93-C-0094 by the Department of the Air Force. The Government has certain rights in the invention.

FIELD OF THE INVENTION

The present invention relates to the field of power distribution systems managing electrical power distributed between connected power sources and energy storage elements over a regulated bus. More particularly, the present invention relates to conforming solar cell power sources to a curve surface for the generation of power distributed in a power distribution system within an orbital satellite.

BACKGROUND OF THE INVENTION

Microsatellites and Nanosatellites in low earth orbits require the collection of sufficient power for onboard instruments and are low weight and low volume satellites. Because the overall surface area of a microsatellite or nanosatellite is small, body-mounted solar cells; are incapable of providing enough power. Deployment of traditional, rigid, solar arrays necessitates larger satellite volumes and weights, and also requires extra apparatus needed for pointing toward the sun to collect solar energy. Nanosats are small orbital satellites becoming increasingly used for space communications because of the decreased deployment costs and lightweight. Nanosats inherently have a limited amount of available power because of a limited amount of space for mounting solar cells. Additionally, because of the small size of the nanosatellite, there is a weight penalty when deploying rigid solar panels with tracking and pointing mechanisms. Satellites have long used means for stowing and deploying a large area of solar cells with minimum weight and volume. This has been accomplished by utilizing solar cells on deployable flat panels that require pointing and that can be sized for various desired power levels. Deployable flat panels disadvantageously require pointing and tracking means as well as rigid deployable flat panels.

In traditional space power systems, individual DC power source devices such as solar cells, and DC energy storage devices such as batteries, have been connected in a series to develop sufficient voltage levels to be useful for supplying power to loads on the satellites. Series connections have been used in both regulated and unregulated buses within a centralized power management and distribution system. Traditionally, individual solar cells have been connected in a series to develop sufficient voltage and are then delivered to the power distribution system. A regulated bus is one where a precise voltage level is maintained and supplied to the loads. To maintain energy balance, the voltage regulator must throttle the amount of current supplied to the bus as required by the Loads at each instant of time. Typically, the regulation of the amount of current that a series connection of power sources supply to the bus has been accomplished by the use of shunt dissipators. These dissipators sense the bus voltage and determine whether the voltage status level is low, indicating that the amount of current being supplied is low, or the voltage status level is high, indicating that the amount of current being supplied is high. Regulated adjustments are then made in the amount of current being supplied to maintain a constant voltage on the regulated bus.

Many power sources and energy storage devices operate more efficiently and can be managed better for longer life if controlled at the individual device level. A solar panel comprises a plurality of parallel connected strings each of which comprises a plurality of series connected solar cells. For solar cells connected in a series, the weakest cell in the series provides the least amount of current. Hence, the weakest series connected solar cell will limit the power output of all of the other solar cells in that series. Hence, the weakest solar cell in the series will limit overall efficiency of that string. In addition, if the current mismatch between the weakest cell and all the other solar cells becomes too great, then the weakest cell will be driven into reverse bias, which could cause damage to the cell and eventual failure of the entire string. To avoid this failure, bypass diodes have been used to shunt current around the affected cell effectively disconnecting it from the string.

Similarly, energy storage devices must be current-matched so they will all charge and discharge at the same rate. The charge cycle is more critical in that overcharging at a high rate can cause damage to the individual storage devices. Each series of storage devices may include a network of bypass electronics as standard procedures on spacecraft to control the charging of individual energy storage devices. Energy storage devices are also typically connected in series. In the event of a failure of one of the storage devices, the entire string of series connected storage devices will fail. Bypass diodes are used to remove from a string one or more of the storage devices, then the string will not produce the desired voltage level, thereby creating a mismatch between operational and failed strings. The voltage level mismatch results in unequal load sharing between the parallel strings of storage devices. A string with a bypassed failed storage device will provide a lesser voltage level than the fully operational strings of storage devices, and the string with the failed storage device will contribute less to the supply of power delivered by the remaining operational strings, thereby reducing overall storage capacity of the storage devices. Further still, satellite power distribution systems typically operate using a single regulator for a string of connected devices and a failure of any one of the devices can cause a catastrophic system failure without the addition of redundant regulators with the attendant addition in complexity and weight. These and other disadvantages will be solved or reduced using the present invention.

SUMMARY OF THE INVENTION

An object of the invention is to collect, store and or distribute power within a power distribution system.

Another object of the invention is to efficiently collect solar power using solar cells deployed on a satellite.

Yet another object of the invention is to conform solar cells to a curved surface with each cell receiving differing amounts of solar illumination providing respective differing amounts of unequal power efficiently managed by a power management system.

Still another object of the invention is to provide a power management system having a plurality of DC power sources and DC energy stores connected to a common regulated bus through respective regulators.

A further object of the invention is to provide a power management system having a plurality of indivisible DC power sources and or indivisible DC energy stores connected to a common regulated bus through respective regulators for operationally isolating the sources and stores from each other.

Yet a further object of the invention is to provide a power management system having a plurality of indivisible DC power sources and or indivisible DC energy stores connected to a common regulated bus through respective regulators for operationally isolating the sources and stores from each other enabling graceful degradation of power distribution in the event that any one or more of the sources or stores fail.

The present invention is directed towards a power distribution system particularly useful for satellites, including microsatellites and nanosatellites. In one form, a deployable power sphere having a curved surface is preferably used to support attached solar cells that may be, for example, disposed in a grid along longitudes and latitudes corresponding and conforming to the shape of a sphere and are used to collect solar energy for a satellite. The solar cells could also be deployed in other grids, such as a hexagonal grid, or in a random arrangement, but conforming to the curved exterior of the power sphere. The power sphere itself need not be a perfect sphere, and may assume any volumetric shape, so long es the solar cells conformed to the exterior curved surface. The solar energy illuminates the conforming solar cells with uneven radiation intensity, and the power distribution system serves to collect this uneven intensity radiation with a high degree of efficiency. The power sphere offers a solution of providing adequate electrical power from unevenly illuminated solar cells to loads in a satellite. The power distribution system end the spherically disposed solar cells enable arbitrary orientation to the sun while efficiently collecting solar energy.

The power distribution system is configured with the individual indivisible DC power sources and DC energy stores connected in parallel to a regulated power bus. The power distribution system is preferably a five-watt power system using solar cells panel as DC power sources and lithium batteries as DC energy stores. The power sources and energy stores are indivisible DC sources and stores. The parallel connection is accomplished through respective microelectronic DC—DC regulators for each power source or energy store. This parallel connection of indivisible sources and stores eliminates the need for series connections of these sources and stores in strings to thereby isolate the indivisible sources and stores from each other while efficiently producing a sufficient voltage level to supply the regulated bus supplying power to the connected load. The use of integrated circuit technology allows the packaging of each of these regulators on a single chip. This integration makes it possible to deploy a large number of individual regulators, each with respective control circuitry, for isolating from each other the power sources and energy stores. In the event that one or more of the indivisible DC power sources or energy stores fail, the power distribution system energy storage and power collection capabilities gracefully degrade while maintaining desired regulated voltage levels on the regulated bus.

The preferred solar power sphere is a spherically shaped solar array that will collect incident sunlight and convert it into direct current electricity. The solar array may use crystalline or thin film flexible solar cells mounted on the curved surface of a deployable structure, such as the power sphere. The power sphere offers a high collection area, low weight, and low stowage volume, while eliminating the need for a solar pointing and tracking mechanism. When solar cells are mounted on a curved surface the indivisible solar cells will each receive a different amount of incident light, and hence the indivisible solar cells will each be producing a different amount of current. In a spherical solar array of this curved arrangement, the solar cells are connected to the respective regulators for coupling respective solar cell output power on to the regulated bus. That solar cell generating the smallest amount of current will not limit the power output of any of the other cells coupled to the bus. Mismatches in current production are solved by the respective direct coupling connection of each indivisible solar cell to the regulated bus. This direct respective parallel connection is accomplished through the respective microelectronics DC—DC regulators. This direct connection eliminates the need for series connections of these DC power sources and energy stores to efficiently produce sufficient voltage to supply the bus. If any one of the solar cells fails, the remaining cells still provide power to the bas through respective regulators to thereby gracefully degrade power production in the event of a solar cell failure. As such, this parallel configuration makes a spherical solar power sphere practicable for space missions.

The power distribution system enables the direct connection of an arbitrary number of individual indivisible DC power source devices and DC energy storage devices onto the bus. The power distribution system developed for the power sphere offers several advantages. Each power source device and energy storage device requires an electrical interface to the regulated bus providing necessary bus sensing and regulation. Direct connection of each individual DC power source device, such as solar cells, and DC energy storage devices, such as batteries, to a regulated bus is accomplished through the respective regulators providing respective regulated amounts of power. Regulation of the amount of current from the energy stores supplied to the bus at each instant of time is accomplished by respective boost converters within the respective regulators. Regulation of the amount of current from the power sources is accomplished using like boost converters in all of the respective regulators. In order to assure that the energy storage devices do not supply current to the bus when sufficient power is available from the power source devices, a bus voltage set point for the power sources is slightly higher than that for the energy storage devices. Hence, each of these DC power sources and energy storage devices have respective regulators that independently respectively determine the solution to the energy balance equation for power coupling onto the bus. This energy balance equation solution is accomplished by sensing the bus voltage in comparison to a reference voltage and then adjusting the amount of current supplied to the bus through pulse width modulation. Each regulator must convert the voltage of the power source device or energy storage device to that of the regulated bus. Both of these tasks are preferably accomplished by use of similar pulse width modulated high frequency DC-DC regulators with associated sensing and control electronics.

For the energy storage devices, the bus interface electronics must be bi-directional, for energy storage at one instance and power delivery at another instance. In addition, the control circuitry of the electrical interface must have separate set points to determine when the bus requires current from the storage device to maintain energy balance, and when sufficient energy is available from the power sources on the bus for recharging the storage devices. Hence, each of the energy stores has a respective regulator for delivery of power onto the bus, and a respective charger for coupling power from the bus into the energy storage device. The interface electronic senses the amount of energy in a storage device and terminates high rate charging when a full charge has been developed in the energy storage device. The interface electronics is also capable of providing a trickle charge rate to fully charge energy storage devices. The use of integrated circuit technology allows the packaging of the interface charging electronics into microchip integrated circuitry. This integration makes possible the deployment of a large number of individual energy storage devices with respective regulators and chargers each with respective control circuitry.

The power distribution system includes a plurality pulse width modulator regulators for obtaining regulated bus control through boost converters for the indivisible power sources and energy stores with switching step-up and step-down voltage regulation for load regulation to regulate the bus at a fixed voltage level. The pulse width modulated DC—DC regulation is utilized for battery charge control. With the emergence of many new battery chemistries, it is becoming increasingly important for a charger to be able to handle multiple battery types. Various intelligent algorithms have been developed for accurately charging batteries so as to provide maximum storage capacity after each charge with increased overall battery cycle life. The chargers enable battery voltage sensing, current sensing, and temperature sensing multiplexed through an A/D converter, to a microcontroller allowing for a smart-charger control and monitoring system to operate the batteries at desired levels.

In general, all component requirements are met by standard commercial-off-the-shelf parts to implement the power sphere and power distribution system. The power distribution system architectural concept developed for the power sphere accommodates graceful degradation in the event of a failure and enables arbitrary orientation to the sun by connecting the indivisible devices in parallel to a regulated spacecraft power bus. These and other advantages will become more apparent from the following detailed description of the preferred embodiment.

DETAILED DESCRIPTION OF THE PREFERRED EMBODIMENT

Figure 1:
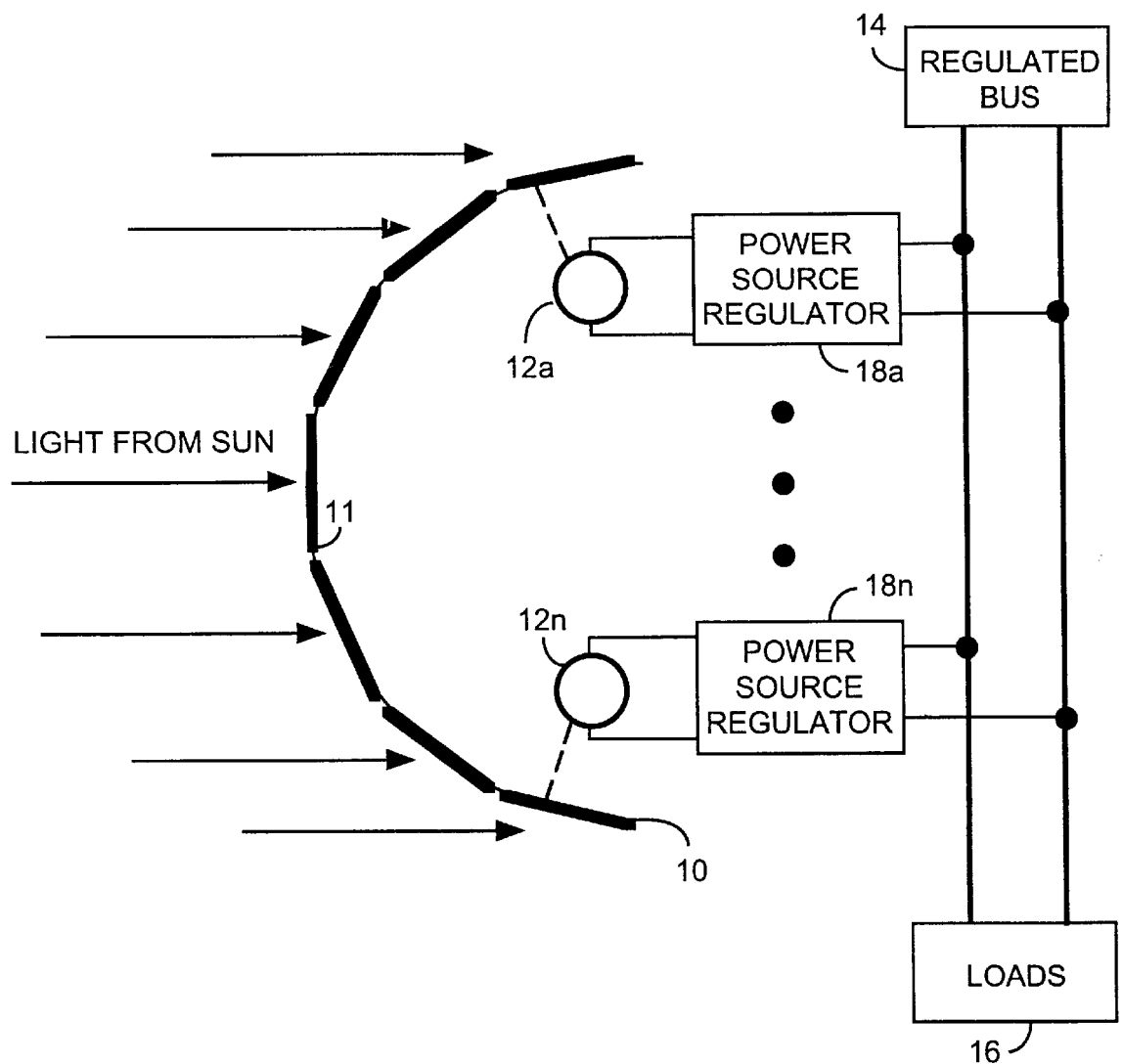
FIG. 1 is a pictorial of a power sphere connected to a power distribution system.

An embodiment of the invention is described with reference to the figures using reference designations as shown in the figures. Referring to FIG. 1, a power sphere 10 includes a curve surface 11 having disposed thereon a plurality of solar cells 12a through 12n receiving uneven sun light illumination. The power sphere 10 can be a deployable sphere deployed from a satellite, not shown, or the power sphere 10 may be a satellite itself. The power sphere 10 can be used as a spinning satellite providing lightweight deployable solar arrays using thin-film solar cells. The power sphere 10 can also be an inflatable support structure. The spherical shape of the solar array 12a–n eliminates any need for sun tracking and array pointing. The power sphere 10 comprising the solar cells 12a–n is preferably used in connection with a power distributed system having a regulated bus 14 connecting a plurality of power source regulators 18a through 18n between respective individual indivisible solar cells 12a–n and the regulated bus 14 for supplying power to a load 16. Each of the solar cells 12a–n is preferably an indivisible solar cell. The solar cells 12a–n are individually connected to the regulated bus 14 through respective regulators 18a–n that are preferably conventional microelectronic DC—DC regulators. The regulated bus 14 may be a regulated five-volt bus. The solar cell 12a–n will provide power onto the two parallel wire regulated five-volt bus. The power distribution system maximizes the energy delivered from each solar cell 12a–n individually through the use of the respective power source regulators 18a–n. In the event of the failure of one of the solar cells 12a–n or one of the respective regulators 18a–n, the power delivered from the remaining solar cells is not affected thereby gracefully degrading power collection and delivery to the extent of the loss of that failed solar cell 12a–n or regulator 18a–n. That is, the power delivered to the bus is the sum of the power collected by all of the solar cells 12a–n, and in the event that one of the solar cells 12a–n fail, the power delivered to the bus is the sum of the power then collected by the remaining surviving operational solar cells 12a–n. Consequently, the overall reliability of the power distribution system is improved by the use of a large number of parallel connected solar cells 12a–n and respective regulators 18a–n so that the loss of any one cell or regulator does not substantially degrade power delivery through the remaining solar cells 12a–n and respective regulators 18a–n.

The power sphere 10 requires a solar cell array comprising several, for example, 32 solar cells 12a–n, that in total will deliver an expected end-of-life amount of power, for example 12.5 watts. The solar cells 12a–n may be thin-film solar cells made of amorphous silicon or copper-indium-gallium-diselenide. The solar cells 12a–n may have an efficiency of approximately five-percent. With this efficiency, the diameter of a spherical inflatable solar array can be small, for example, 57 cm. The total weight of the solar array including the solar cells 12a–n, inflatable structure, not shown, integrated power distribution system and harness, not shown, may be in the range of 400 to 500 grams. The solar cells 12a–n can be integrated into the inflatable structure that would be rigidized after deployment. The power distribution system is preferably integrated with an inflatable thin film structure as the power sphere 10. The solar array may utilize thermal coatings, not shown, that will limit the maximum temperature at any point to 80° C. In order to minimize mismatch losses on the solar cells 12a–n and to take maximum advantage of microcircuit technology to reduce power distribution system weight, the solar array has individual DC—DC regulators 18a–n for each of the individual indivisible solar cells 12a–n of the spherical solar array. The DC—DC regulators 18a–n will regulate the amount of power delivered to the load 16 connected to the bus 14. A solar cell 12a–n is indivisible when it consists of only one solar cell that is not divided into a plurality of cells.

Figure 2:
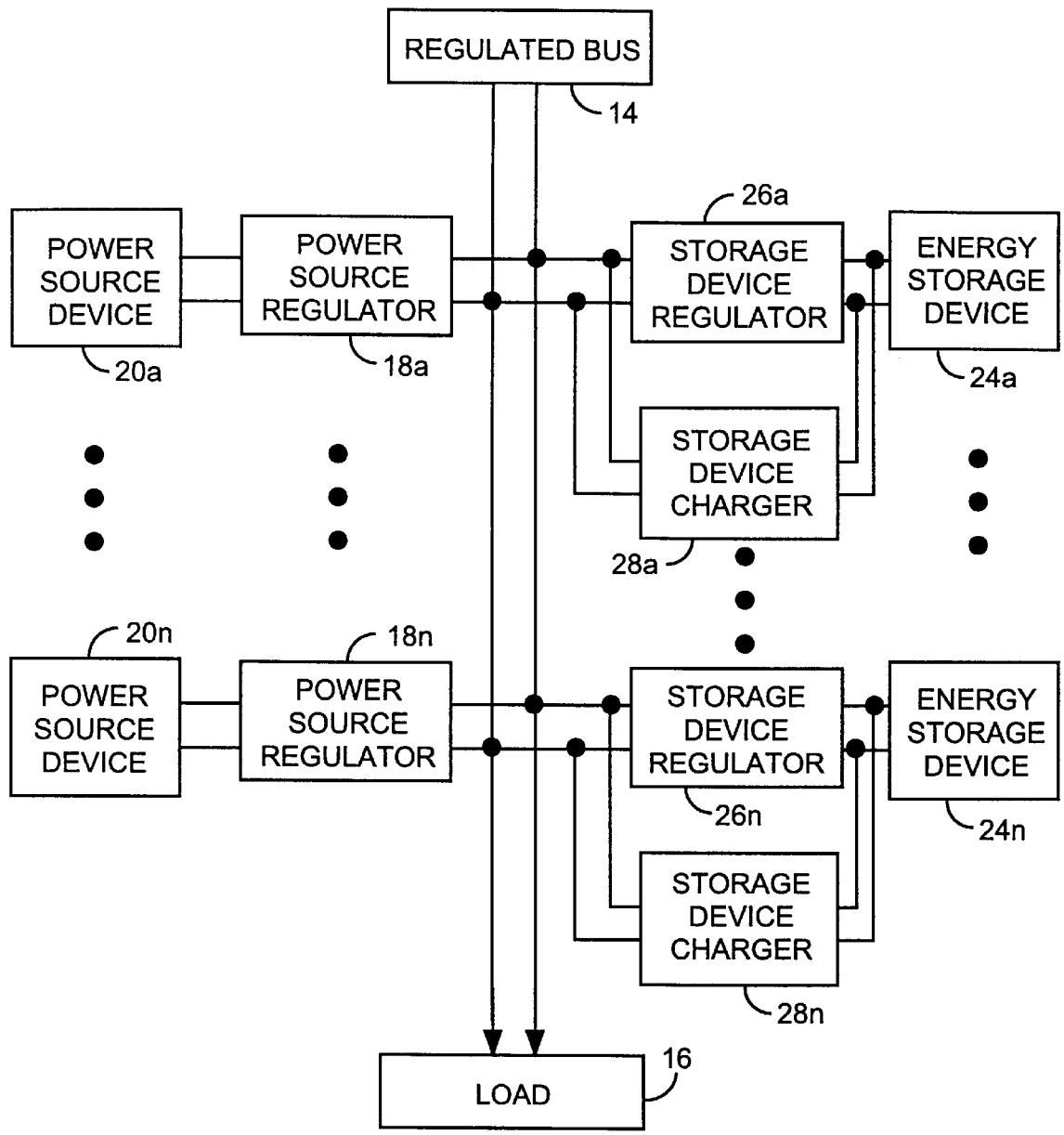
FIG. 2 is a block diagram of the power distribution system.

Referring to FIGS. 1, and 2, and in a general form of the invention, the power distribution system may include an array of individual indivisible power source devices 20a–n, such as the solar cells 12a–n, with respective power source regulators 18a–n, all of which are respectively connected together as pairs each consisting of a DC power source device 12a–n and a power source regulator 18a–n, and, all of these pairs are connected in parallel to the regulated bus 14. The power distribution system may further include a plurality of individual indivisible DC energy storage devices 24*a–n* each having a respective energy storage regulator 26*a–n* for providing power onto the bus 14. Charging power from the bus 14 to the energy storage devices 24*a–n* will typically be sourced from the power source devices 20*a–n*. Each individual indivisible DC energy storage device 24*a–n* is further connected to bus 14 through respective storage device chargers 28*a–n*. Hence, each DC energy storage device 24*a–n* is coupled to the bus 14 through respective storage device regulators 26*a–n* for delivering power onto the bus, and through respective storage device chargers 28*a–n* for charging the energy storage devices 24*a–n*. In the exemplar case of solar cells 12*a–n* used as the DC power source devices 20*a–n*, as the sun illumination increases, the solar cells 12*a–n* provide increased power onto the bus 14 to the load 16 and to the energy storage devices 24*a–n*. As the solar illumination decreases, when the power from the solar cells 12*a–n* decreases, the energy storage devices 24*a–n* provide power back onto the bus 14 and to the load 16. Preset voltage trigger points are used to determine at what point power is delivered onto the bus 14 from the power source devices 20*a–n* and at what point power is delivered back onto the bus 14 by the energy storage devices 24*a–n*. The trigger voltage level for the power source regulator 18*a–n* is slightly greater than the trigger voltage level of the energy storage regulator 26*a–n* so that the energy storage devices 24*a–n* are either being charged by the power source devices 20*a–n* or are delivering power to the load 16.

Figure 3:
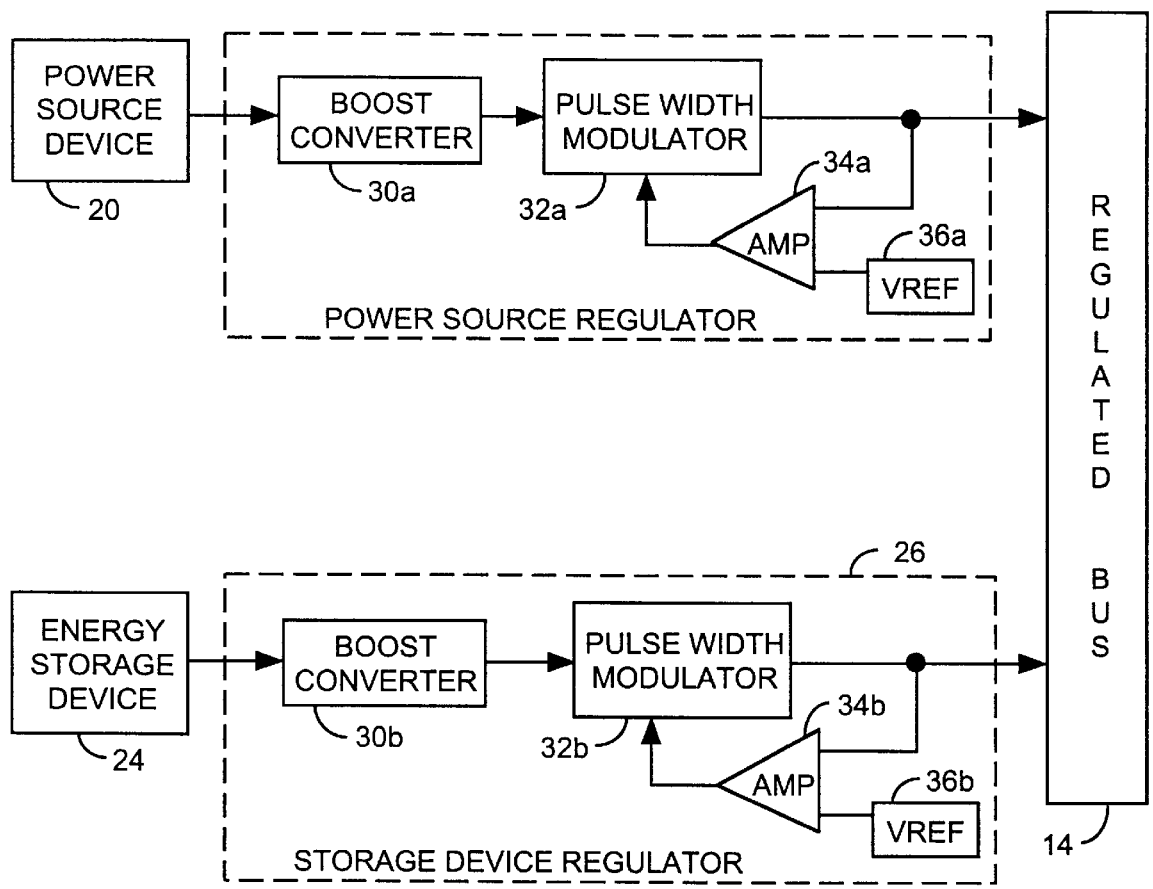
FIG. 3 is a block diagram of parallel-connected regulators.

Referring to FIG. 3, each storage device regulator 20 and each power source regulator 26 may be of conventional design and may be identical in configuration to each other. Each regulator 18 and 26 respectively includes a boost converter 30*a* and 30*b*, a pulse width modulator 32*a* and 32*b*, an error amplifier 34*a* and 34*b*, and a voltage reference 36*a* and 36*b*. The regulators 18 and 26 may be identical but having different voltage references 36*a* and 36*b* for setting respective low and high trigger levels. The voltage reference 36*a* for the power source regulator 18 sets a high trigger level that may be for example 5.05 volts, and the voltage reference 36*b* for the energy storage regulator 26 sets the low trigger level that may be for example 5.00 volts, being slightly less than the high trigger level. The power source regulator 18 supplies power onto the bus 14 when the bus voltage level is less than high trigger reference 36*a*, and when the power source device 20 is supplying power to the regulator 18. The energy storage regulator 26 supplies power onto the bus 14 when the bus voltage level drops below the low trigger voltage reference 36*b*. The boost converter 30*a* receives the output voltage of the power source device 20 and boosts it up to a level higher than the voltage reference 36*a*. The pulse width modulator 32*a* and feed back amplifier 34*a* in connection with the voltage reference 36*a* provide regulated pulse width modulated power onto the regulated bus 14 to regulate the amount on current delivered onto the bus 14 to maintain the regulated bus 14 at the desired operational bus voltage level. The regulators 18 and 26 are preferably commercially available regulators, for example, MAX882 5V Low-Dropout, Low IQ, 200 mA Linear Regulators.

Figure 4:
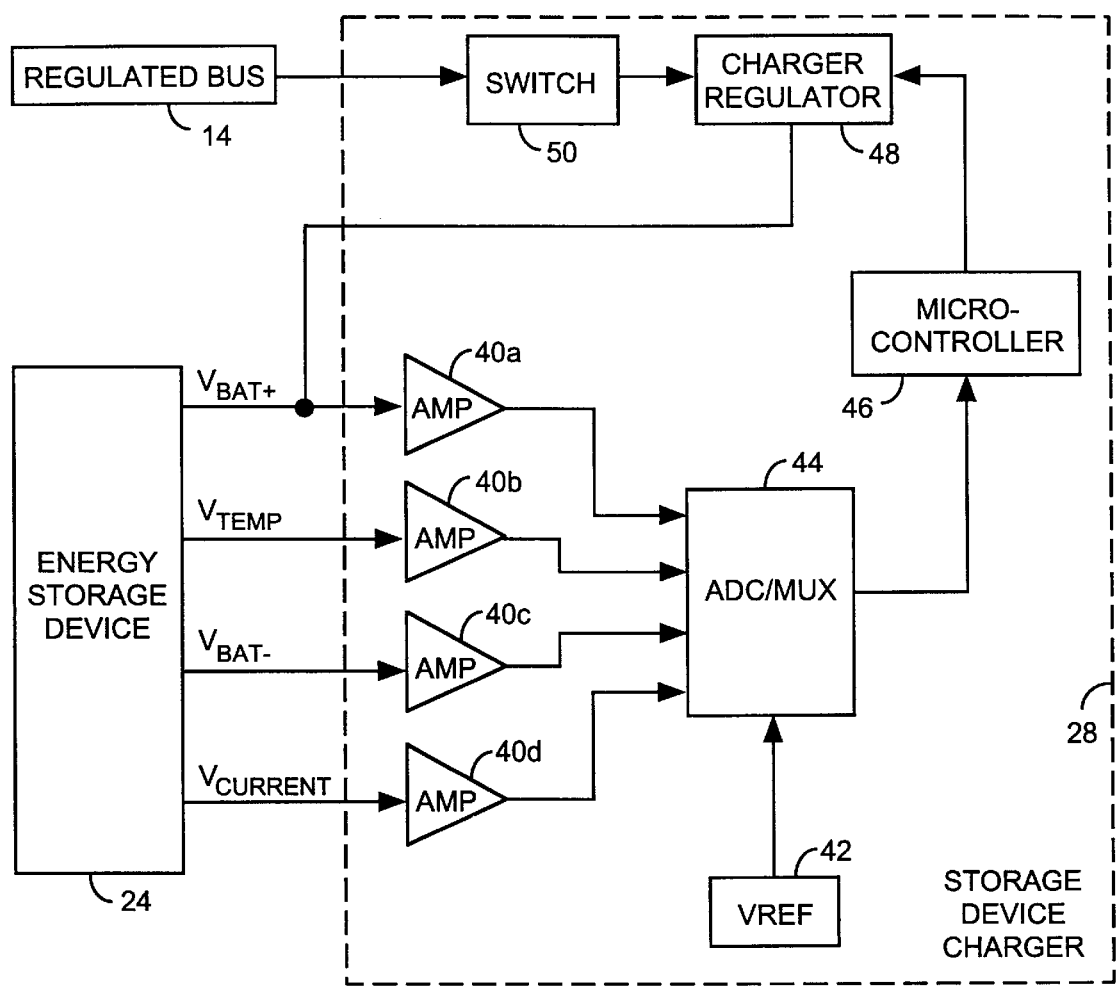
FIG. 4 is a block diagram of an energy storage charger.

Referring to all of the Figures, and more particularly to FIG. 4, each storage device charger 28 is used to deliver power from the bus 14 to a respective storage device 24, to thereby charge the energy storage device 24 when the bus voltage level exceeds a charger trigger level of the charger 28. The charger trigger level is preferably set between the high trigger level of power source regulator voltage reference 36*a* and the low trigger level of the storage devices reference level 35*b*. For example, the charger trigger level may be set at 5.025 volts, to thereby charge the energy storage device 24 when the storage device regulator 26 is turned off, and when the power source regulator 18 is providing power onto the bus 14, but in excess of the system bus desire voltage level determined by the low trigger level. When there is excess energy from the power source devices 12, in excess of the demands of the load 16, the regulated bus 14 routes the excess energy through the chargers 28 into the energy storage devices 24. In the case where the energy storage device is a battery, the charger 28 may include input amplifiers 40*a*, 40*b*, 40*c* and 40*d* for respectively receiving battery signals, including a positive battery voltage reference signal, a battery temperature signal, a negative battery voltage reference signal, and a battery current signal. The charger 28 further includes a charger voltage reference 42. The battery signals from amplifiers 40*a–d* and the charger voltage reference 42 are communicated through an analog to digital multiplexer 44 to a microcontroller 46. The charger voltage reference 42 sets the charger trigger level as sensed by the microcontroller 46 for controlling a charger regulator 48 that provides power from the bus 14 through a controlled switch 50, through the charger regulator 48 to the energy storage device 24. The switch 50 is connected to the bus 14 and charger regulator 48 for routing excess power from the bus 14 to charge regulator 48 that in turns provides a regulated pulse width modulated charge signal to the energy storage device 24. The storage device charger 28 may be of conventional design, for example, a MAX846A Multichemistry Battery-Charger System.

The power distribution system has all of the individual indivisible DC power sources 20*a–n*, such as solar cells 12*a–n*, and DC energy storage devices 24*a–n*, such as batteries, connected in parallel to a regulated spacecraft power bus 14 that in turn supplies power to the load 16. This parallel connection is made by the individual respective microcircuit based power regulators 18*a–n* and 26*a–n* and chargers 28*a–n* and these devices provide the necessary transformation of voltage from that developed by each individual power source device or energy storage device. The regulators 26*a–n* and chargers 28*a–n* provide an interface between the regulated bus 14 and the energy storage devices 24*a–n*. The DC energy storage devices 24*a–n* are typically batteries, but other DC storage devices, such as bulk storage capacitors could be used as the DC energy storage devices. An exemplar battery is the lithium ion battery. The lithium ion battery cells for micro and nano satellite applications may contain 2.0 Ah of storage energy capacity. The battery 24 may be supported and located in the center of the inflatable power sphere structure 10. The storage device regulators 26*a–n* and the storage device chargers 28*a–n* for respectively regulating the discharging and charging of the battery cells 24*a–n* may be located juxtapose the batteries 24*a–n*. The power distribution system regulators 26*a–n* and chargers 28*a–n*, and battery cells 24*a–n* may be thermally isolated from one another. The battery and associated rower distribution system electronics for the battery weigh in the range of 200 to 300 grams.

The DC power source devices 20*a–n* are preferably solar cells 12*a–n* in the case of space deployment, but other types of DC power sources could be used, for examples, various indivisible primary battery cells and radioactive thermal generators conventionally coupled together in a string. The solar cells 12*a–n* are preferably thin film amorphous silicon solar cells disposed on a two-millimeter polyamide film. The stabilized efficiency of these cells is approximately 5%. The weight of the cells is 0.009 grams per square centimeter. The cells may be thermally shocked by immersion in liquid nitrogen several times with no degradation in performance. Solar cells 12a–n may further be subjected to over thermal test cycling between −95° C. to +95° C. Other types of thin film solar cells 12a–n may be used for example, copper-indium-gallium-diselenide solar cells 12a–n to produce thin-film lightweight solar cells 12a–n, on a variety of substrates. These solar cells 12a–n have the potential of reaching an efficiency of 17% with an air mass of 1.5. The mass of these solar cells 12a–n is 0.0094 grams per square centimeter. Devices on the polyamide substrates have been tested under simulated space environments and have been shown to be space qualified. In thermal testing, there was no degradation after 2000 thermal cycles between −100° C. to +80° C., and the material has demonstrated superior radiation tolerance to proton and electron exposures.

Regulators 18a–n and 26a–n and chargers 28a–n of the power distribution system may be integrated into the thin film inflatable structure, which supports the solar, cells 12a–n. The two-wire power bus 14 for interconnecting all components of the power sphere is also preferably integrated into the thin film structure. The power sphere 10 hence may be an inflatable rigidizable structure. The thin film solar cells 12a–n may be supported by an inflatable and rigidizable frame for a geodetic sphere that may comprised, for example, twenty hexagons and twelve pentagons compactly disposed on the exterior of the power sphere. One approach for rigidization uses a thin film laminate, not shown, to form a space frame for the power sphere 10. The power sphere 10 deploys by inflation and upon reaching its final shape, an over-pressurize pulse stresses the laminate into plasticity, thus forming a network of monocoque cylindrical struts, not shown. Another approach is to form the inflatable struts out of an ultraviolet curable laminate that would rigidize after deployment. In both approaches the solar array 12a–n is preferably deployed through sublimation of powder such as benzoic acid and anthraquinone for gas generation. The power required to deploy the array is thereby minimized.

The power sphere 10 preferably uses a combination of inflatable structures with thin film solar cell technology to provide all of the electric power required by a micro or nano satellite within the weight constraints imposed by these small vehicles. The use of a spherical shape for the solar array 12a–n eliminates the need for sun tracking by the array and the additional mass associated with the larger surface areas of the deployed array is more than offset by the mass savings for array pointing and sun tracking systems. The use of the innovative power distribution system overcomes the series loss that would be incurred in a spherical array by eliminating any series connections of solar cells on the array. The power sphere 10 provides a relatively benign thermal environment for the lithium ion batteries and the use of micro electronic DC—DC regulators and battery chargers in a decentralized power distribution system configuration reduces the total mass. The use of commercial power distribution system components and application terrestrial solar cell technology to the power sphere 10 provide for a low cost option to conventional space power system components. Those skilled in the art can make enhancements, improvements and modifications to the invention, and these enhancements, improvements and modifications may nonetheless fall within the spirit and scope of the following claims.

What is claimed is:

1. A power sphere for delivering solar power to a regulated bus, the sphere comprising, a curved surface, a plurality of solar cells for collecting the solar power through solar illumination, the plurality of solar cells are each indivisible solar cells disposed upon the curved surface and conforming to the curved surface so that each of the plurality of solar cells receive differing amounts of solar power, and a plurality of regulators respectively coupling the differing amount of solar power from the respective plurality of solar cells to the regulated bus, the total power collected from the plurality of solar cells and the consequential delivered power to the regulated bus is the sum of the amount of power collected by all of the plurality of solar cells.

2. The power sphere of claim 1 wherein the curved surface is a sphere.

3. The power sphere of claim 1 wherein the plurality of solar cells are thin film solar cells.

4. The power sphere of claim 1 further comprises, a load connected to the regulated bus.

5. The power sphere of claim 1 wherein, the plurality of regulators are pulse width modulating regulators transforming the solar power collected by the plurality of solar cells into pulse width modulated current coupled onto the regulated bus.

6. The power sphere of claim 1 wherein, the curved surface is a plurality of adjoining flat surfaces.

* * * * *